(12) United States Patent
Yuan et al.

(10) Patent No.: US 11,882,729 B2
(45) Date of Patent: Jan. 23, 2024

(54) DISPLAY SUBSTRATE AND METHOD FOR MANUFACTURING THE SAME, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 386 days.

(21) Appl. No.: 17/433,435

(22) PCT Filed: Nov. 13, 2020

(86) PCT No.: PCT/CN2020/128809
§ 371 (c)(1),
(2) Date: Aug. 24, 2021

(87) PCT Pub. No.: WO2021/098610
PCT Pub. Date: May 27, 2021

(65) Prior Publication Data
US 2022/0165829 A1    May 26, 2022

(30) Foreign Application Priority Data

Nov. 19, 2019   (CN) .......................... 201911135746.2

(51) Int. Cl.
  *H01L 27/32* (2006.01)
  *H10K 59/121* (2023.01)
  (Continued)

(52) U.S. Cl.
  CPC ....... *H10K 59/1216* (2023.02); *H10K 59/131* (2023.02); *H10K 71/00* (2023.02);
  (Continued)

(58) Field of Classification Search
  CPC .. H10K 59/1216; H10K 59/131; H10K 71/00; H10K 59/1201; H10K 59/1213;
  (Continued)

(56) References Cited

U.S. PATENT DOCUMENTS

2014/0175393 A1   6/2014  Beak et al.
2016/0247869 A1   8/2016  Li et al.
(Continued)

FOREIGN PATENT DOCUMENTS

CN    103904099 A    7/2014
CN    104157678 A   11/2014
(Continued)

*Primary Examiner* — Mohammed R Alam
(74) *Attorney, Agent, or Firm* — IP & T GROUP LLP

(57) ABSTRACT

A display substrate comprises a pixel driving circuit and a bottom-emission light-emitting device that are disposed on a base and located in each sub-pixel in a display area. The light-emitting device includes a first electrode electrically connected to the pixel driving circuit. The pixel driving circuit includes a first storage capacitor and a second storage capacitor connected in parallel. The first storage capacitor includes a first storage electrode and a second storage electrode that are disposed oppositely, and the first electrode serves as the first storage electrode. The second storage capacitor includes the second storage electrode and a third storage electrode that are disposed oppositely. The second storage electrode is located between the first storage electrode and the third storage electrode. The first storage electrode is electrically connected to the third storage electrode. The first electrode, the second storage electrode, and the third storage electrode are all transparent electrodes.

16 Claims, 12 Drawing Sheets

(51) Int. Cl.
  *H10K 59/131*  (2023.01)
  *H10K 71/00*   (2023.01)
  H01L 27/12    (2006.01)
  H10K 59/12    (2023.01)

(52) U.S. Cl.
  CPC ........ *H01L 27/124* (2013.01); *H10K 59/1201* (2023.02); *H10K 59/1213* (2023.02)

(58) Field of Classification Search
  CPC . H10K 59/126; H01L 27/124; H01L 27/1255; H01L 28/60
  See application file for complete search history.

(56) References Cited

U.S. PATENT DOCUMENTS

2017/0294497 A1* 10/2017 Lius ................... H01L 27/1225
2020/0381524 A1   12/2020 Xu et al.

FOREIGN PATENT DOCUMENTS

| CN | 107785405 A | 3/2018 |
| CN | 108550553 A | 9/2018 |
| CN | 208738252 U | 4/2019 |
| CN | 110752247 A | 2/2020 |
| CN | 110783490 A | 2/2020 |
| CN | 210467845 U | 5/2020 |
| KR | 10-2018-0061902 A | 6/2018 |

\* cited by examiner

E-E'

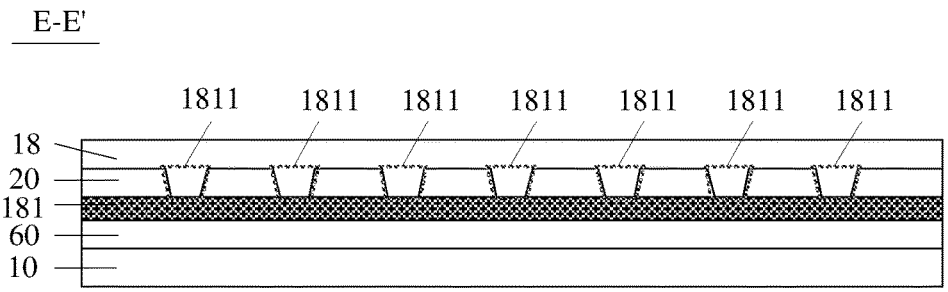

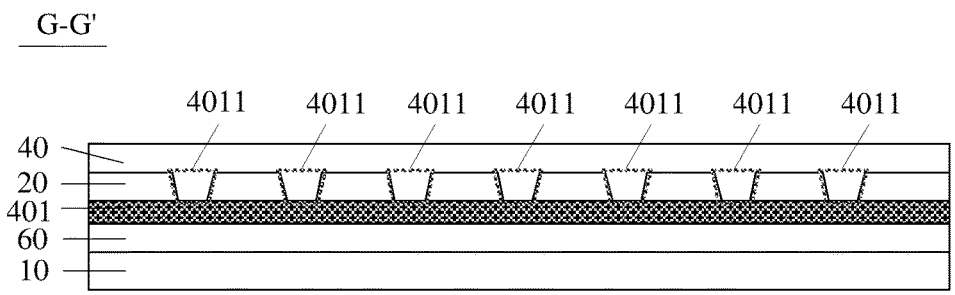

FIG. 15

The pixel driving circuit located in each sub-pixel S is formed in the display area AA on the base 10. The pixel driving circuit includes the first storage capacitor 120 and the second storage capacitor 130 connected in parallel. The first storage capacitor 120 includes the first storage electrode 121 and the second storage electrode 122 that are disposed oppositely. The second storage capacitor 130 includes the second storage electrode 122 and the third storage electrode 123 disposed opposite to the second storage electrode 122. The second storage electrode 122 is located between the first storage electrode 121 and the third storage electrode 123 in the thickness direction of the base 10. The first storage electrode 121 is electrically connected to the third storage electrode 123, and the first storage electrode 121 is located at the side of the second storage electrode 122 away from the base 10. The first storage electrode 121, the second storage electrode 122, and the third storage electrode 123 are all transparent electrodes. ⎯S10

The bottom-emission light-emitting device in each sub-pixel S on the base 10 is formed on a side of the pixel driving circuit away from the base 10. The light-emitting device 110 includes a first electrode 111. The first electrode 111 is connected to the pixel driving circuit. In addition, the first storage electrode 121 serves as the first electrode 111. ⎯S20

FIG. 16

DISPLAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/128809 filed on Nov. 13, 2020, which claims priority to Chinese Patent Application No. 201911135746.2, filed with the Chinese Patent Office on Nov. 19, 2019, titled "DISPLAY PANEL AND METHOD FOR MANUFACTURING THE SAME", which are incorporated herein by reference in their entirety.

TECHNICAL FIELD

The present disclosure relates to the field of display technologies, and in particular, to a display substrate and a method for manufacturing the same, and a display apparatus.

BACKGROUND

Self-luminescent display substrates such as organic light-emitting diode (OLED) display substrates have advantages of self-luminescence, lightness and thinness, low power consumption, good color reproduction, sensitive response, wide viewing angle and the like. They have been more and more widely used in display apparatuses such as mobile phones, notebook computers, and televisions, and have become one of the mainstreams in the current market.

SUMMARY

In an aspect, some embodiments of the present disclosure provide a display substrate having a display area, the display area has a plurality of sub-pixels. The display substrate includes a base, and a pixel driving circuit and a bottom-emission light-emitting device that are disposed on the base and located in each sub-pixel in the display area. The light-emitting device includes a first electrode electrically connected to the pixel driving circuit. The pixel driving circuit includes a first storage capacitor and a second storage capacitor connected in parallel. The first storage capacitor includes a first storage electrode and a second storage electrode that are disposed oppositely. The first electrode serves as the first storage electrode. The second storage capacitor includes the second storage electrode and a third storage electrode disposed opposite to the second storage electrode. The second storage electrode is located between the first storage electrode and the third storage electrode in a thickness direction of the base. The first storage electrode is electrically connected to the third storage electrode. The first electrode, the second storage electrode, and the third storage electrode are all transparent electrodes.

In some embodiments, the display substrate further includes power lines. The pixel driving circuit further includes a first transistor, and the first transistor is a driving transistor. The first transistor includes a first gate, a first semiconductor active pattern, and a first source. The first semiconductor active pattern includes a first channel portion, a first source portion, and a first drain portion, and electrical conductivities of the first source portion and the first drain portion are greater than an electrical conductivity of the first channel portion. The first source is in direct contact with the first source portion. The first source is electrically connected to a power line. The third storage electrode is a semiconductor pattern that has undergone a conducting processing, the third storage electrode and the first drain portion are connected to each other, and are of an integral structure.

In some embodiments, the display substrate further includes: a gate line and a data line that are electrically connected to the pixel driving circuit, and a first connection electrode disposed in the sub-pixel. The pixel driving circuit further includes a second transistor, and the second transistor includes a second gate, a second semiconductor active pattern, a second source and a second drain. A portion of the gate line serves as the second gate. The second source is electrically connected to the data line. The second drain and the first connection electrode are of an integral structure. The first connection electrode is electrically connected to the first gate and the second storage electrode.

In some embodiments, the first connection electrode is in direct contact with the second storage electrode, and the first connection electrode is electrically connected to the first gate through a via hole.

In some embodiments, the display substrate further includes sensing signal lines, the pixel driving circuit is electrically connected to a sensing signal line. The pixel driving circuit further includes a third transistor, and in an extension direction of the sensing signal line, the first transistor and the third transistor are located at both sides of the first storage capacitor. The third transistor includes a third gate, a third semiconductor active pattern, and a third drain. The third semiconductor active pattern includes a third channel portion, a third source portion, and a third drain portion, and electrical conductivities of the third source portion and the third drain portion are greater than an electrical conductivity of the third channel portion. The third source portion and the third storage electrode are connected to each other, and are of an integral structure. The third drain is in direct contact with the third drain portion, and is electrically connected to the sensing signal line.

In some embodiments, for third gates of third transistors located in any row of sub-pixels, portions of the gate line connected to second transistors in an adjacent row of sub-pixels closest to the third transistors in the row of sub-pixels serve as the third gates of the third transistors.

In some embodiments, the power line, the sensing signal line, and the data line are arranged in parallel and in a same layer.

In each row of sub-pixels, every two adjacent sub-pixels are as a group, and two data lines are disposed between the two sub-pixels in each group. A position at a side of each group of sub-pixels is provided with one power line, a position at an opposite side of the group of sub-pixels is provided with one sensing signal line, and the power lines and the sensing signal lines are arranged alternately.

For each row of sub-pixels, pixel driving circuits in two sub-pixels located at a side of the power line and proximate to the power line and pixel driving circuits in two sub-pixels located at another side of the power line and proximate to the power line are all electrically connected to the power line.

For each row of sub-pixels, pixel driving circuits in two sub-pixels located at a side of the sensing signal line and proximate to the sensing signal line and pixel driving circuits in two sub-pixels located at another side of the sensing signal line and proximate to the sensing signal line are all electrically connected to the sensing signal line.

In some embodiments, the display substrate further includes: a first auxiliary electrode disposed corresponding to any power line, and a second auxiliary electrode disposed corresponding to any sensing signal line. An orthogonal projection of the first auxiliary electrode on the base is located within an orthogonal projection of the power line on the base in the thickness direction of the base. The first auxiliary electrode is electrically connected to the power line through a plurality of first via holes. An orthogonal projection of the second auxiliary electrode on the base is located within an orthogonal projection of the sensing signal line on the base in the thickness direction of the base. The second auxiliary electrode is electrically connected to the sensing signal line through a plurality of second via holes. The first auxiliary electrode, the second auxiliary electrode, and the first gate are arranged in a same layer and made of a same material.

In some embodiments, the display substrate further includes: filter units disposed between the first storage electrode and the second storage electrode in the sub-pixel, and a planarization layer disposed on a side of the filter units proximate to the first storage electrode.

In some embodiments, the first transistor is a top-gate thin film transistor. The display substrate further includes a metal pattern disposed at a side of the first semiconductor active pattern proximate to the base. An orthogonal projection of the first semiconductor active pattern on the base is located within an orthogonal projection of the metal pattern on the base in the thickness direction of the base. The display substrate further includes a second connection electrode disposed in the sub-pixel. The metal pattern, the first storage electrode, and the third storage electrode are electrically connected through the second connection electrode. The second connection electrode and the first source are arranged in a same layer and made of a same material.

In another aspect, the embodiments of the present disclosure further provide a method for manufacturing a display substrate. The method for manufacturing the display substrate includes following steps.

A pixel driving circuit located in each sub-pixel is formed in a display area on a base. The pixel driving circuit includes a first storage capacitor and a second storage capacitor connected in parallel. The first storage capacitor includes a first storage electrode and a second storage electrode that are disposed oppositely. The second storage capacitor includes the second storage electrode and a third storage electrode disposed opposite to the second storage electrode. The second storage electrode is located between the first storage electrode and the third storage electrode in a thickness direction of the base. The first storage electrode is electrically connected to the third storage electrode, and is located at a side of the second storage electrode away from the base. The first storage electrode, the second storage electrode, and the third storage electrode are all transparent electrodes.

A bottom-emission light-emitting device located on a side of the pixel driving circuit away from the base is formed in the sub-pixel on the base. The light-emitting device includes a first electrode electrically connected to the pixel driving circuit, and the first storage electrode serves as the first electrode.

In some embodiments, the pixel driving circuit further includes a first transistor, and the first transistor is a driving transistor. The first transistor includes a first gate, a first semiconductor active pattern, and a first source. The first semiconductor active pattern includes a first channel portion, a first source portion and a first drain portion, and electrical conductivities of the first source portion and the first drain portion are greater than an electrical conductivity of the first channel portion. The first source is in contact with the first source portion.

Forming the pixel driving circuit further includes: simultaneously forming the third storage electrode in a process of forming the first semiconductor active pattern, so that the third storage electrode and the first drain portion are connected to each other and are of an integral structure.

In some embodiments, the display substrate further includes: a gate line and a data line that are electrically connected to the pixel driving circuit, and a first connection electrode disposed in the sub-pixel. The pixel driving circuit further includes a second transistor. The second transistor includes a second gate, a second semiconductor active pattern, a second source and a second drain. The second semiconductor active pattern includes a second channel portion, a second source portion and a second drain portion, and electrical conductivities of the second source portion and the second drain portion are greater than an electrical conductivity of the second channel portion. The second source is in direct contact with the second source portion, and the second drain is in direct contact with the second drain portion.

Forming the pixel driving circuit further includes: simultaneously forming the second semiconductor active pattern in a process of forming the first semiconductor active pattern. A portion of the gate line serves as the second gate. The method for manufacturing the display substrate further includes: simultaneously forming the gate line in a process of forming the first gate.

The second source is electrically connected to the data line. The second drain and the first connection electrode are electrically connected to each other and are of an integral structure. The first connection electrode is further electrically connected to the first gate and the second storage electrode. The method for manufacturing the display substrate further includes: simultaneously forming the first connection electrode, the second source, the second drain, the data line in a process of forming the first source.

In some embodiments, the display substrate further includes a power line and a sensing signal line that are electrically connected to the pixel driving circuit. The first source is electrically connected to the power line. The pixel driving circuit further includes a third transistor. The third transistor includes a third gate, a third semiconductor active pattern, and a third drain. The third semiconductor active pattern includes a third channel portion, a third source portion and a third drain portion, and electrical conductivities of the third source portion and the third drain portion are greater than an electrical conductivity of the third channel portion. The third source portion and the third storage electrode are connected to each other and are of an integral structure. The third drain is in direct contact with the third drain portion, and is electrically connected to the sensing signal line.

The first transistor and the third transistor are located at both sides of the first storage capacitor in an extension direction of the sensing signal line. For third gates of third transistors located in any row of sub-pixels, portions of the gate line connected to second transistors in an adjacent row of sub-pixels closest to the third transistors in the row of sub-pixels serve as the third gates of the third transistors.

Forming the pixel driving circuit further includes: simultaneously forming the third semiconductor active pattern in a process of forming the second semiconductor active pattern. The method for manufacturing the display substrate further includes: simultaneously forming the third drain, the power line and the sensing signal line in a process of forming the data line.

In some embodiments, the method for manufacturing the display substrate further includes: forming a metal pattern on the base before forming the pixel driving circuit, so that after the pixel driving circuit is formed, an orthogonal projection of the first semiconductor active pattern on the base is within an orthogonal projection of the metal pattern on the base in the thickness direction of the base.

In some embodiments, the display substrate further includes a second connection electrode disposed in the sub-pixel. The method for manufacturing the display substrate further includes: simultaneously forming the second connection electrode in a process of forming the first source, so that the second connection electrode is electrically connected to the metal pattern, the first storage electrode, and the third storage electrode.

In yet another aspect, the embodiments of the present disclosure provide a display apparatus. The display apparatus includes the display substrate as described in any of the above embodiments.

BRIEF DESCRIPTION OF THE DRAWINGS

In order to describe technical solutions in the embodiments of the present disclosure more clearly, the accompanying drawings to be used in the description of the embodiments will be introduced briefly. Obviously, the accompanying drawings to be described below are merely accompanying drawings of some embodiments of the present disclosure, and a person of ordinary skill in the art may obtain other drawings according to those drawings without paying any creative effort.

FIG. 14 is a schematic cross-sectional view of the display substrate shown in FIG. 13 taken along the line EE';

FIG. 15 is a schematic cross-sectional view of the display substrate shown in FIG. 13 taken along the line GG';

FIG. 16 is a schematic flow diagram of a method for manufacturing a display substrate, in accordance with some embodiments of the present disclosure;

DETAILED DESCRIPTION

Figure 1:
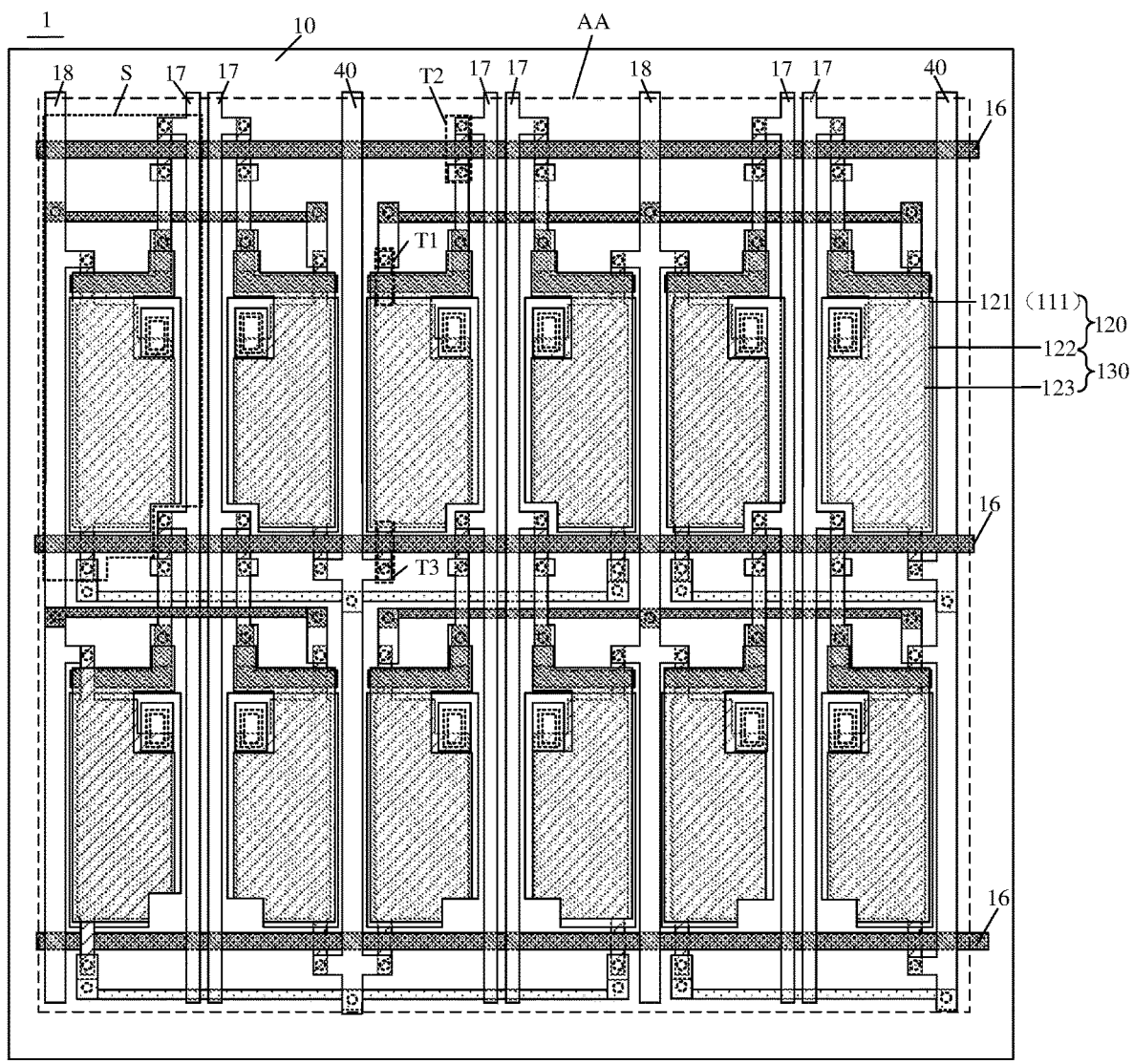
FIG. 1 is a schematic diagram showing a structure of a portion of a display substrate, in accordance with some embodiments of the present disclosure.

Technical solutions in embodiments of the present disclosure will be described below clearly and completely with reference to the accompanying drawings in the embodiments of the present disclosure. Obviously, the described embodiments are merely some but not all of embodiments of the present disclosure. All other embodiments obtained on the basis of the embodiments of the present disclosure by a person of ordinary skill in the art without paying any creative effort shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" and other ordinals are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of", "the plurality of" or "multiple" means two or more unless otherwise specified.

In the description of some embodiments, the expressions "electrically connected" and "in contact with", and their derivatives may be used. For example, the term "electrically connected" or "in contact with" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or exceeding those stated values.

In the related art, a pixel driving circuit and a light-emitting device electrically connected to the pixel driving circuit are disposed in each sub-pixel of a self-luminescent display substrate. In a case where an area of a single sub-pixel is limited, a storage capacitor in the pixel driving circuit and the light-emitting device are located in different regions of the sub-pixel, so that a crossover line may be formed at an electrical connection position between the storage capacitor and the light-emitting device, thereby increasing a risk of crosstalk. Moreover, if an overlapping area of the storage capacitor is set to be large, an area of the sub-pixel occupied by the storage capacitor is also large. In this way, for a bottom-emission display substrate in which the pixel driving circuit is located on a light-exit side of the light-emitting device, the storage capacitor occupying a large area of the sub-pixel will easily lead to a small aperture ratio of the sub-pixel and a small light-emitting area of the light-emitting device. Therefore, in a case where the display brightness is same, the smaller the light-emitting area of the light-emitting device is, the larger a current density that is required is. As a result, an aging speed of the light-emitting device is easily accelerated, and service life of the light-emitting device is easily affected. However, if the overlapping area of the storage capacitor is set to be small, capacitance of the storage capacitor is likely to be small. Further, a problem of uneven display quality of the display substrate may occur.

Figure 2:
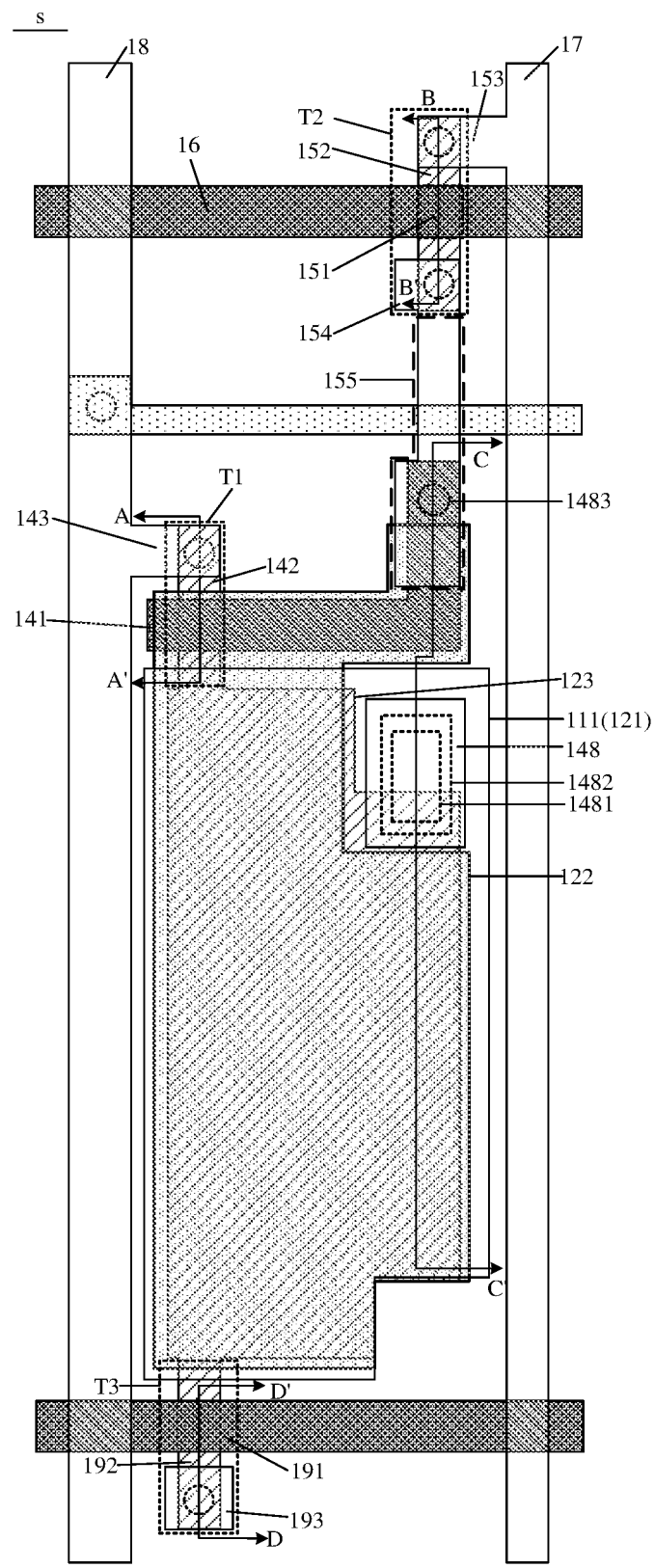
FIG. 2 is a schematic diagram showing a structure of a sub-pixel S in the display substrate shown in FIG. 1.

Referring to FIGS. 1 and 2, some embodiments of the present disclosure provide a display substrate 1. The display substrate 1 has a display area AA, and the display area AA of the display substrate 1 are provided with a plurality of sub-pixels S. It will be understood with reference to FIGS. 2, 3a, 3b, and 4 that, the display substrate 1 includes a base 10, and a pixel driving circuit and a bottom-emission light-emitting device 110 that are disposed on the base 10 and located in each sub-pixel S in the display area AA. The light-emitting device includes a first electrode 111 electrically connected to the pixel driving circuit.

Figure 4:
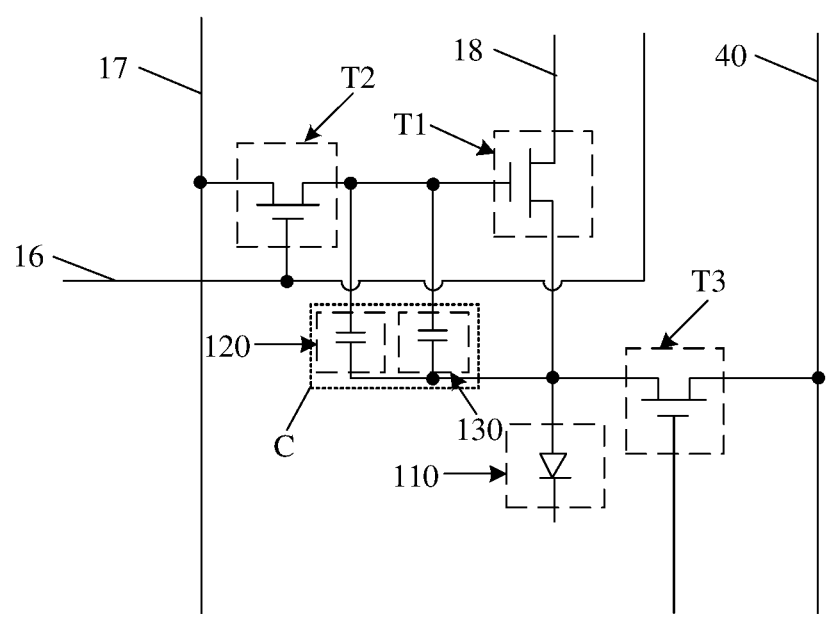
FIG. 4 is an equivalent circuit diagram of a pixel driving circuit, in accordance with some embodiments of the present disclosure.

As shown in FIGS. 1, 2, and 4, the pixel driving circuit includes a first storage capacitor 120 and a second storage capacitor 130 connected in parallel. The first storage capacitor 120 includes a first storage electrode 121 and a second storage electrode 122 that are disposed oppositely. The second storage capacitor 130 includes the second storage electrode 122 and a third storage electrode 123 disposed opposite to the second storage electrode 122. The second storage electrode 122 is located between the first storage electrode 121 and the third storage electrode 123 in a thickness direction of the base 10. The first electrode 111 serves as the first storage electrode 121, and the first storage electrode 121 is electrically connected to the third storage electrode 123. The first electrode 111, the second storage electrode 122, and the third storage electrode 123 are all transparent electrodes.

Since the light-emitting device 110 is the bottom-emission light-emitting device, that is, the pixel driving circuit is located on a light-exit side of the light-emitting device 110, it will be understood by those skilled in the art that, in a case where the first electrode 111 serves as the first storage electrode 121, the third storage electrode 123 is located at a side of the second storage electrode 122 proximate to the base 10. Herein, that the first storage electrode 121 and the second storage electrode 122 are disposed oppositely refers to that orthogonal projections of the two storage electrodes on the base 10 at least partially overlap. That the second storage electrode 122 and the third storage electrode 123 are disposed oppositely refer to that orthogonal projections of the two storage electrodes on the base 10 at least partially overlap. In addition, the first storage capacitor 120 and the second storage capacitor 130 adopt the structure described above, which may also be regarded as: the two storage capacitors forming a storage capacitor C with a sandwich-like structure.

It will be noted that, distribution and structures of the sub-pixels S in only a portion of the display substrate 1 are illustrated in FIG. 1, and a structure of the light-emitting device 110 is also only partially illustrated.

Figure 3A:
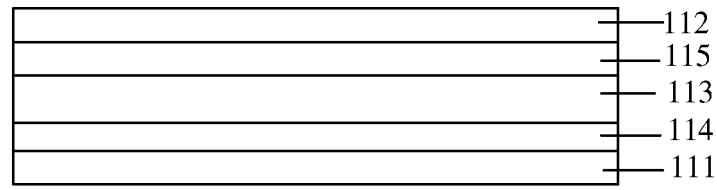
FIG. 3a is a schematic diagram showing a structure of a bottom-emission light-emitting device, in accordance with some embodiments of the present disclosure.
Figure 3B:
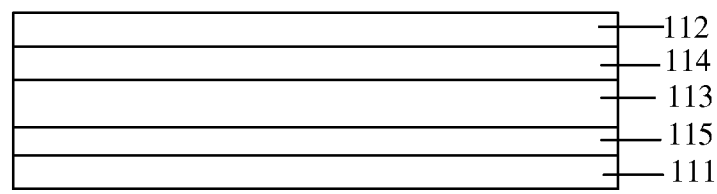
FIG. 3b is a schematic diagram showing a structure of another bottom-emission light-emitting device, in accordance with some embodiments of the present disclosure.

Optionally, as shown in FIGS. 3a and 3b, the light-emitting device 110 includes a first electrode 111, a second electrode 112, and a light-emitting layer 113 located between the first electrode 111 and the second electrode 112.

Optionally, the first electrode 111 is an anode, and the second electrode 112 is a cathode; or, the first electrode 111 is a cathode, and the second electrode 112 is an anode.

It will be understood that, in a case where the first electrode 111 is the anode and the second electrode 112 is the cathode, the light-emitting device 110 is upright. In a case where the first electrode 111 is the cathode and the second electrode 112 is the anode, the light-emitting device 110 is inverted.

Further, as shown in FIG. 3a, in a case where the first electrode 111 is the anode and the second electrode 112 is the cathode, the light-emitting device 110 further includes a hole transport layer 114 located between the light-emitting layer 113 and the first electrode 111, and an electron transport layer 115 located between the light-emitting layer 113 and the second electrode 112. Of course, in some embodiments, according to needs, a hole injection layer may be disposed between the hole transport layer 114 and the first electrode 111, and an electron injection layer may be disposed between the electron transport layer 115 and the second electrode 112.

For example, as shown in FIG. 3b, in a case where the first electrode 111 is the cathode and the second electrode 112 is the anode, the light-emitting device 110 further includes a hole transport layer 114 located between the light-emitting layer 113 and the second electrode 112, and an electron transport layer 115 located between the light-emitting layer 113 and the first electrode 111. Of course, a hole injection layer may be disposed between the hole transport layer 114 and the second electrode 112, and an electron injection layer may be disposed between the electron transport layer 115 and the first electrode 111.

Further, optionally, the light-emitting layer 113 may be an organic light-emitting layer or a quantum dot light-emitting layer.

Optionally, a material of the first electrode 111 is indium tin oxide (ITO), and a material of the second electrode 112 is silver (Ag), which are not limited thereto.

It will be noted that, the pixel driving circuit involved subsequently in the embodiments of the present disclosure will be described with the light-emitting device 110 as an upright light-emitting device. In addition, a pixel defining layer is usually disposed in the display substrate 1, the light-emitting device 110 is formed in a corresponding opening of the pixel defining layer. An opening area of the pixel defining layer may be used to define a light-emitting area of the sub-pixel S. A material of the pixel defining layer may be a transparent resin material.

In the display substrate 1 provided by the embodiments of the present disclosure, the first electrode 111 of the light-emitting device 110 serves as the first storage electrode 121, and the first electrode 111, the second storage electrode 122, and the third storage electrode 123 located in different layers are all set to be transparent electrodes, so that the storage capacitor C (i.e., the first storage capacitor 120 and the second storage capacitor 130 connected in parallel) in the pixel driving circuit is disposed in a region opposite to the light-emitting device 110, that is, the storage capacitor C is located in a light-emitting region of the light-emitting device 110 and does not affect the light-emitting effect of the light-emitting device 110. In this way, in an aspect, the first electrode 111 of the light-emitting device 110 serves as the first storage electrode 121 of the first storage capacitor 120, the second storage electrode 122 is disposed opposite to the first storage electrode 121, the third storage electrode 123 is disposed opposite to the second storage electrode 122, and the first storage electrode 121 is electrically connected to the third storage electrode 123, so that the crossover line may be avoided when the light-emitting device 110 is electrically connected to the first storage capacitor 120 and the second storage capacitor 130, thereby avoiding a risk of crosstalk. In another aspect, in a case of ensuring a normal display of the display substrate 1, the first storage capacitor 120 and the second storage capacitor 130 may not additionally occupy an area outside the light-emitting region in the sub-pixel S. In this way, in a case where the sub-pixel S has a certain area, the light-emitting region of the light-emitting device 110 may occupy more area in the sub-pixel S, thereby increasing the aperture ratio of the sub-pixel S and increasing the service life of the light-emitting device 110. In yet another aspect, since the first electrode 111, the second storage electrode 122, and the third storage electrode 123 are all transparent electrodes, areas of the second storage electrode 122 and the third storage electrode 123 may be set as large as possible, and the first storage capacitor 120 is electrically connected in parallel with the second storage capacitor 130, so that the capacitance of the storage capacitor C in the pixel driving circuit may effectively increase, so as to avoid the problem of uneven display quality of the display substrate 1.

In a case where the display substrate 1 in the embodiments of the present disclosure is applied as a display substrate with pixels per inch (PPI) of 8 K, an average aperture ratio of the sub-pixels in the display substrate may increase to approximately 28% compared with the average aperture ratio of sub-pixels of approximately 12% in the related art, thereby effectively increasing by approximately 160%.

The structure of the pixel driving circuit may be selectively set according to actual needs, for example, a 3T1C pixel circuit shown in FIG. 4 is adopted. That is, the pixel driving circuit may be composed of three transistors T and a storage capacitor C. The three transistors are a first transistor T1, a second transistor T2, and a third transistor T3, and the storage capacitor C is the first storage capacitor 120 and the second storage capacitor 130 that are connected in parallel in some of the foregoing embodiments. Of course, the pixel driving circuit may also have a structure including other number of transistors or other number of storage capacitors, which is not limited in the embodiments of the present disclosure.

The following embodiments are described by taking an example in which the pixel driving circuit is a 3T1C pixel circuit.

Figure 5:
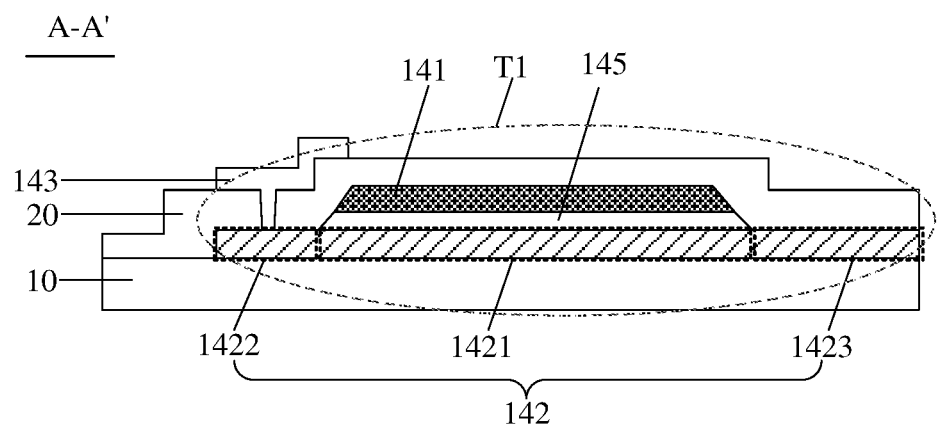
FIG. 5 is a schematic cross-sectional view of the sub-pixel S shown in FIG. 2 taken along the line AA'.

Optionally, the structure of the pixel driving circuit in a single sub-pixel S is as shown in FIGS. 1, 2, and 4, the pixel driving circuit further includes a first transistor T1, and the first transistor T1 is a driving transistor. As shown in FIG. 5, the first transistor T1 includes a first gate 141, a first semiconductor active pattern 142, and a first source 143. The first semiconductor active pattern 142 includes a first channel portion 1421, a first source portion 1422, and a first drain portion 1423, and electrical conductivities of the first source portion 1422 and the first drain portion 1423 are greater than an electrical conductivity of the first channel portion 1421. The first source 143 is in contact with the first source portion 1422. The first source 143 is electrically connected to a power line 18 of power lines 18 included in the display substrate 1. The power line 18 is used to supply power to the pixel driving circuit.

It will be understood with reference to FIGS. 2, 4, and 5 that, the third storage electrode 123 may be obtained by performing conducting on a semiconductor pattern, that is, the third storage electrode 123 may be a semiconductor pattern that has undergone a conducting processing. Based on this, the third storage electrode 123 is connected to the first drain portion 1423, and the third storage electrode 123 and the first drain portion 1423 are of an integral structure. Since the third storage electrode 123 is electrically connected to the first storage electrode 121, and the first storage electrode 121 may serve as the first electrode 111 of the light-emitting device 110, there is no need to form a separate first drain in the first transistor T1 to be electrically connected to the first electrode 111.

During the manufacturing, a semiconductor pattern located at positions of the first transistor T1 and the third storage electrode 123 is formed first, and then other regions, of the semiconductor pattern, except a position of the first channel portion 1421 of the first transistor T1 are conducted. For example, conducting process may be performed by adopting a manner of ion implantation, and ions may be boron ions or phosphorus ions.

In addition, it will be noted that, for the first transistor T1 or subsequent other transistors, source and drain refer to other two electrodes except the gate. The source and the drain of the transistor may be interchanged according to different types of carriers in the transistor, which is not limited in the embodiments of the present disclosure, but is merely used to assist in describing the structure of the transistor and corresponding electrical connection relationship.

Illustration is made by taking an example in which the first transistor T1 in FIGS. 2 and 5 is a top-gate thin film transistor. In this case, as shown in FIG. 5, the first semiconductor active pattern 142 is disposed on a side of the first gate 141 proximate to the base 10, and the first semiconductor active pattern 142 and the first gate 141 are insulated through a first gate insulating pattern 145, and the first source 143 and the first gate 141 are insulated through an interlayer insulating layer 20. Based on this, the conducting process may be performed after the first gate 141 is formed.

Optionally, as shown in FIG. 5, the first gate insulating pattern 145 and the first gate 141 may be formed simultaneously. Based on this, the first source 143 is in direct contact with the first semiconductor active pattern 142 through a via hole penetrating the interlayer insulating layer 20.

Herein, "being formed simultaneously" refers to formation by using a same patterning process, such as a mask process. "Being formed simultaneously" involved in the embodiments of the present disclosure may be understood in this way, which is not limited thereto.

it will be understood by those skilled in the art that, in a case where a gate insulating layer located between the first semiconductor active pattern 142 and the first gate 141 is not patterned, the first source 143 is in direct contact with the first semiconductor active pattern 142 through a via hole penetrating the interlayer insulating layer 20 and the gate insulating layer.

In the embodiments of the present disclosure, the third storage electrode 123 is formed while the first semiconductor active pattern 142 of the first transistor T1 is formed, so that the third storage electrode 123 may be formed on a basis of no adding an additional patterning process.

Figure 6:
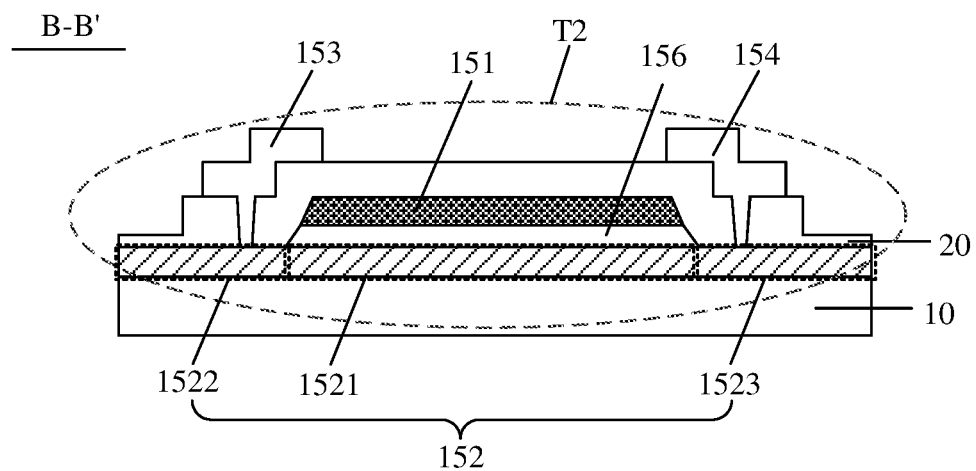
FIG. 6 is a schematic cross-sectional view of the sub-pixel S shown in FIG. 2 taken along the line BB'.

Optionally, as shown in FIGS. 1, 2, and 6, the pixel driving circuit further includes a second transistor T2, and the second transistor T2 includes a second gate 151, a second semiconductor active pattern 152, a second source 153, and a second drain 154.

As shown in FIG. 6, the second semiconductor active pattern 152 includes a second channel portion 1521, a second source portion 1522, and a second drain portion 1523. Electrical conductivities of the second source portion 1522 and the second drain portion 1523 are greater than an electrical conductivity of the second channel portion 1521. The second source 153 is in direct contact with a portion of the second semiconductor active pattern 152 corresponding to the second source portion 1522, and the second drain 154 is in direct contact with a portion of the second semiconductor active pattern 152 corresponding to the second drain portion 1523.

It will be understood that, based on the structure of the first semiconductor active pattern 142 in the first transistor T1 described above, the second semiconductor active pattern 152 in the second transistor T2 is also similar to the first semiconductor active pattern 142. In this case, the second transistor T2 and the first transistor T1 may be formed simultaneously. That is, the second gate 151 of the second transistor T2 and the first gate 141 of the first transistor T1 are formed simultaneously, the second semiconductor active pattern 152 of the second transistor T2 and the first semiconductor active pattern 142 of the first transistor T1 are formed simultaneously, and the second source 153 and the second drain 154 of the second transistor T2 and the first source 143 of the first transistor T1 are formed simultaneously.

It will be noted that, illustration is made by taking an example in which the second transistor T2 in FIGS. 2 and 6 is a top-gate thin film transistor. In this case, the second semiconductor active pattern 152 is disposed on a side of the second gate 151 proximate to the base 10. The second semiconductor active pattern 152 and the second gate 151 are insulated through a second gate insulating pattern 156, and the second source 153 and the second drain 154 are both insulated from the second gate 151 through the interlayer insulating layer 20.

Optionally, as shown in FIG. 5, the second gate insulating pattern 156 and the second gate 151 may be formed simultaneously. Based on this, the second source 153 and the second drain 154 are in contact with the second semiconductor active pattern 152 through via holes penetrating the interlayer insulating layer 20. Of course, similar to the first transistor T1, in a case where a gate insulating layer located between the second semiconductor active pattern 152 and the second gate 151 is not patterned, the second source 153 and the second drain 154 are in direct contact with the second semiconductor active pattern 152 through via holes penetrating the interlayer insulating layer 20 and the gate insulating layer.

Further, as shown in FIGS. 1 and 2, the display substrate 1 further includes a gate line 16 and a data line 17 that are electrically connected to the pixel driving circuit. A portion of the gate line 16 severs as the second gate 151 of the second transistor T2, which may effectively reduce the area occupied by the pixel driving circuit in the sub-pixel S and improve the aperture ratio of the sub-pixel. In addition, the second source 153 of the second transistor T2 is electrically connected to the data line 17.

Figure 7:
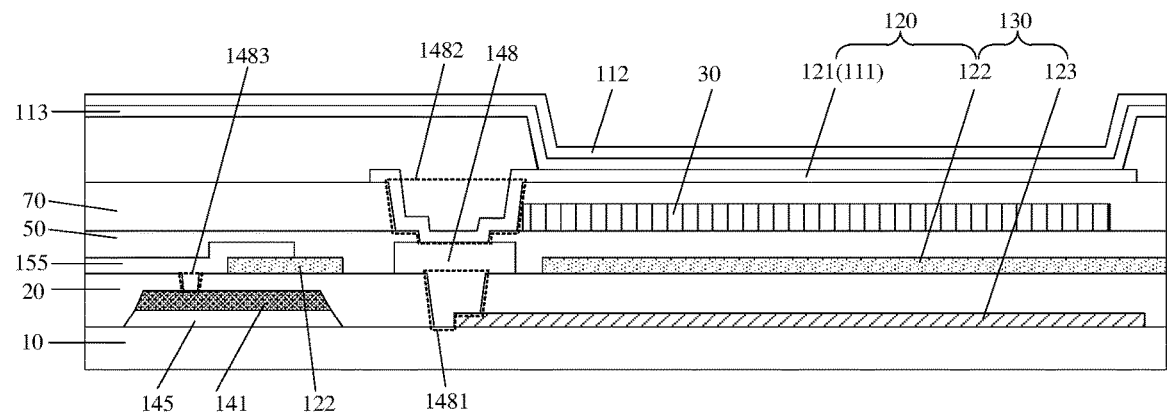
FIG. 7 is a schematic cross-sectional view of the sub-pixel S shown in FIG. 2 taken along the line CC'.

As shown in FIGS. 1, 2, and 7, the display substrate 1 further includes a first connection electrode 155 disposed in each sub-pixel S. The second drain 154 of the second transistor T2 is electrically connected to the first connection electrode 155, and the second drain 154 and the first connection electrode 155 are of an integral structure. The first connection electrode 155 is electrically connected to both the first gate 141 of the first transistor T1 and the second storage electrode 122. That is, electrical connections among the first transistor T1, the second transistor T2, the first storage capacitor 120, and the second storage capacitor 130 may be achieved through the first connection electrode 155.

Optionally, as shown in FIGS. 2 and 7, the first connection electrode 155 is in direct contact with the second storage electrode 122, and the first connection electrode 155 is electrically connected to the first gate 141 through a via hole 1483. That the first connection electrode 155 is in direct contact with the second storage electrode 122 refers to that the first connection electrode 155 covers a portion of the second storage electrode 122, thereby achieving lapping of the two electrodes.

Optionally, as shown in FIG. 7, the display substrate 1 further includes a second connection electrode 148 disposed in each sub-pixel S. The first storage electrode 121 is electrically connected to the third storage electrode 123 through the second connection electrode 148. For example, as shown in FIG. 7, in a case where the display substrate 1 includes the interlayer insulating layer 20, a passivation layer 50, and a planarization layer 70, the second connection electrode 148 may be in direct contact with the third storage electrode 123 through a via hole 1481 penetrating the interlayer insulating layer 20, and the second connection electrode 148 is in direct contact with the first storage electrode 121 through a via hole 1482 penetrating the planarization layer 70 and the passivation layer 50, so that an electrical connection between the first storage electrode 121 and the third storage electrode 123 may be achieved.

Further, optionally, the second connection electrode 148 is disposed in a same layer and made of a same material as the first connection electrode 155.

Figure 8:
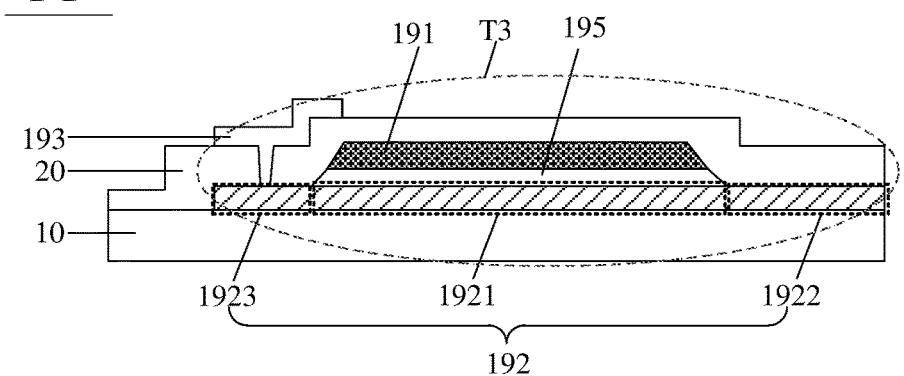
FIG. 8 is a schematic cross-sectional view of the sub-pixel S shown in FIG. 2 taken along the line DD'.

Optionally, as shown in FIGS. 1, 2, and 8, in a case where the pixel driving circuit includes the second transistor T2, the pixel driving circuit further includes a third transistor T3, and the third transistor T3 includes a third gate 191, a third semiconductor active pattern 192, and a third drain 193.

It will be noted that, illustration is made by taking an example in which the third transistor T3 in FIGS. 2 and 8 is a top-gate thin film transistor. In this case, the third semiconductor active pattern 192 is disposed on a side of the third gate 191 proximate to the base 10, the third semiconductor active pattern 192 and the third gate 191 are insulated through a third gate insulating pattern 195, and the third drain 193 and the third gate 191 are insulated through the interlayer insulating layer 20.

In a case where the first gate insulating pattern 145 and the first gate 141 are formed simultaneously, as shown in FIG. 8, the third gate insulating pattern 195 and the third gate 191 are formed simultaneously. Based on this, the third drain 193 is in contact with the third semiconductor active pattern 192 through a via hole penetrating the interlayer insulating layer 20. Of course, similar to the first transistor T1, in a case where a gate insulating layer is not patterned, the third drain 153 is in direct contact with the third semiconductor active pattern 192 through a via hole penetrating the interlayer insulating layer 20 and the gate insulating layer.

It will be understood with reference to FIGS. 1, 2, 4, and 8 that, the third semiconductor active pattern 192 includes a third channel portion 1921, a third source portion 1922, and a third drain portion 1923, and electrical conductivities of the third source portion 1922 and the third drain portion 1923 are greater than an electrical conductivity of the third channel portion 1921. The display substrate 1 further includes sensing signal lines 40. The third drain 193 is in contact with the third drain portion 1923, and the third drain 193 is electrically connected to a sensing signal line 40. The third source portion 1922 is connected to the third storage electrode 123, and the third source portion 1922 and the third storage electrode 123 are of an integral structure. Since the third storage electrode 123 is electrically connected to the first storage electrode 121, and the first storage electrode 121 may serve as the first electrode 111 of the light-emitting device 110, there is no need to form a separate third source in the third transistor T3 to be electrically connected to the first electrode 111.

In a case where the pixel driving circuit includes the first transistor T1, the second transistor T2, the third transistor T3, the first storage capacitor 120, and the second storage capacitor 130, an equivalent circuit diagram thereof is as shown in FIG. 4. The first storage capacitor 120 and the second storage capacitor 130 constitute the storage capacitor C. In this case, the pixel driving circuit may be a 3T1C driving circuit. Based on this, a parameter of the first transistor T1 may be sensed through the sensing signal line 40, and then a threshold voltage of the first transistor T1 may be compensated by means of external compensation.

Based on the above, for example, materials of the first gate 141, the second gate 151, the third gate 191, the first source 143, the second source 153, the second drain 154, the third drain 193, the gate line 16, the data line 17, the sensing signal line 40, and the power line 18 may be selected from at least one of metal elements such as copper (Cu), aluminum (Al), molybdenum (Mo), titanium (Ti), chromium (Cr) and tungsten (W), and metal alloys composed of these metal elements.

For example, materials of the first gate insulating pattern 145, the second gate insulating pattern 156, the third gate insulating pattern 195, and the interlayer insulating layer 20 may be selected from one or more of inorganic oxides such as silicon nitride ($SiN_x$) and silicon dioxide ($SiO_2$). The first gate insulating pattern 145, the second gate insulating pattern 156, the third gate insulating pattern 195, and the interlayer insulating layer 20 may adopt a single-layer structure or a multi-layer stacked structure. Materials of the first semiconductor active pattern 142, the second semiconductor active pattern 152, and the third semiconductor active pattern 192 may be selected from transparent semiconductor oxides such as indium zinc oxide (IGZO).

As shown in FIG. 1, the data line 17, the power line 18, and the sensing signal line 40 extend in a first direction. Optionally, the first transistor T1 and the third transistor T3 are located at both sides of the first storage capacitor 120 in the first direction.

Further, optionally, as shown in FIG. 1, for the third gates 191 of the third transistors T3 in any row of sub-pixels S, portions of the gate line 16 connected to second transistors in an adjacent row of sub-pixels S closest to the third transistors T3 in the row of sub-pixels serve as the third gates 191 of the third transistors T3, As a result, it is beneficial to reduce the area occupied by the pixel driving circuit in the sub-pixel S in a case where a plurality of sub-pixels S are arranged in an array, so as to increase the aperture ratio of the sub-pixel.

It will be understood with reference to FIG. 1 that, in the embodiments of the present disclosure, the third gate 191 of the third transistor T3 in any sub-pixel S and the second gate 151 of the second transistor T2 in the adjacent row of sub-pixels S closest to the third transistor T3 may be different portions of a same gate line 16. As a result, a total number of the gate lines 16 in the display substrate 1 may be reduced, so as to simplify the manufacturing process of the display substrate 1.

Figure 9:
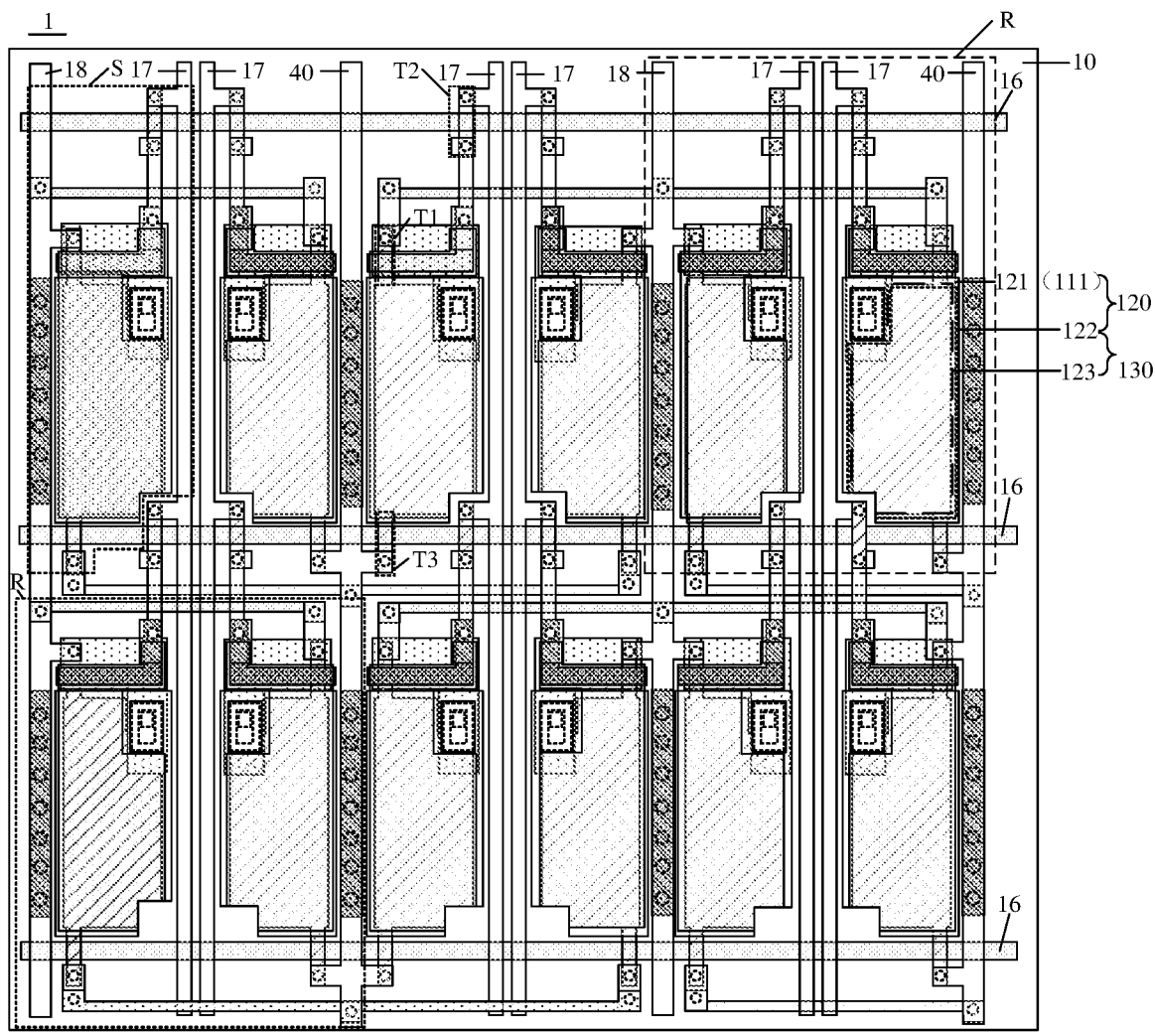
FIG. 9 is a schematic diagram showing a structure of a portion of another display substrate, in accordance with some embodiments of the present disclosure.
Figure 10:
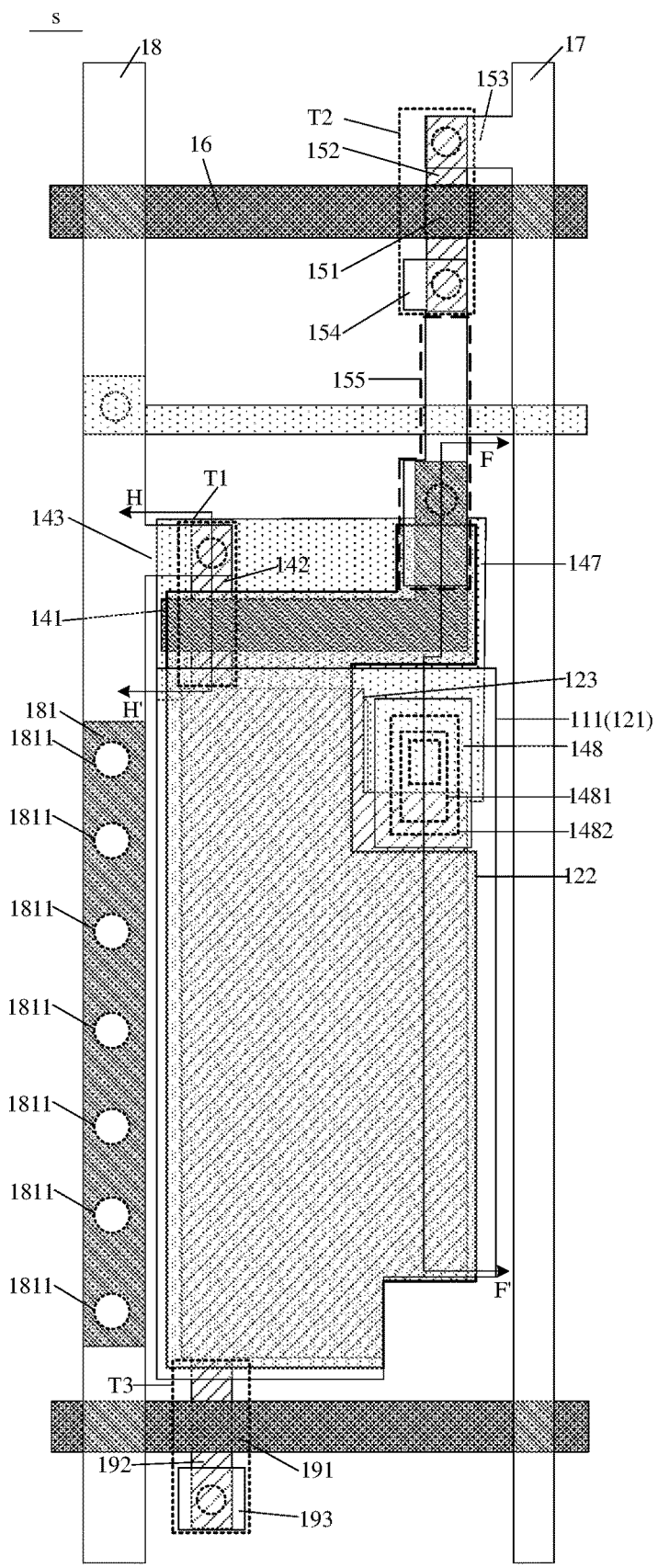
FIG. 10 is a schematic diagram showing a structure of a sub-pixel S in the display substrate shown in FIG. 9.
Figure 12:
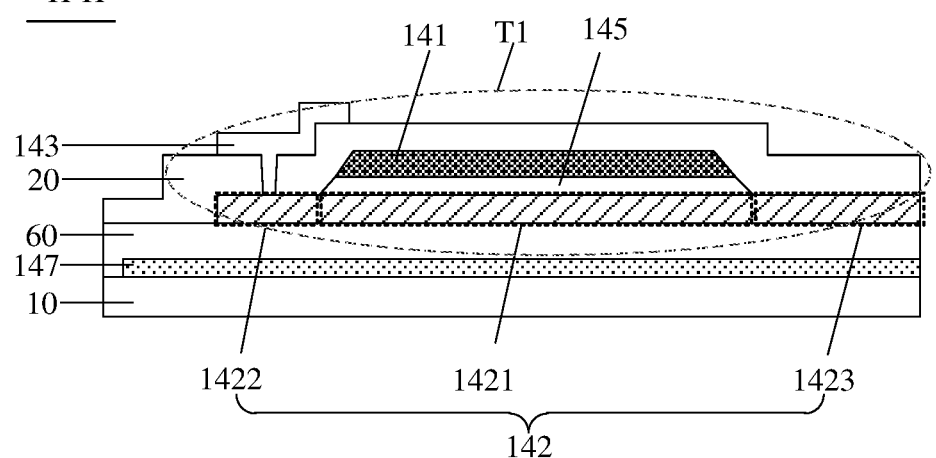
FIG. 12 is a schematic cross-sectional view of the sub-pixel S shown in FIG. 10 taken along the line HH'.

Optionally, in a case where the first transistor T1 is a top-gate thin film transistor, as shown in FIGS. 9, 10, and 12, the display substrate 1 further includes a metal pattern 147 disposed on a side of the first semiconductor active pattern 142 proximate to the base 10. An orthogonal projection of the first semiconductor active pattern 142 on the base 10 is located within an orthogonal projection of the metal pattern 147 on the base 10 in the thickness direction of the base 10.

Figure 11:
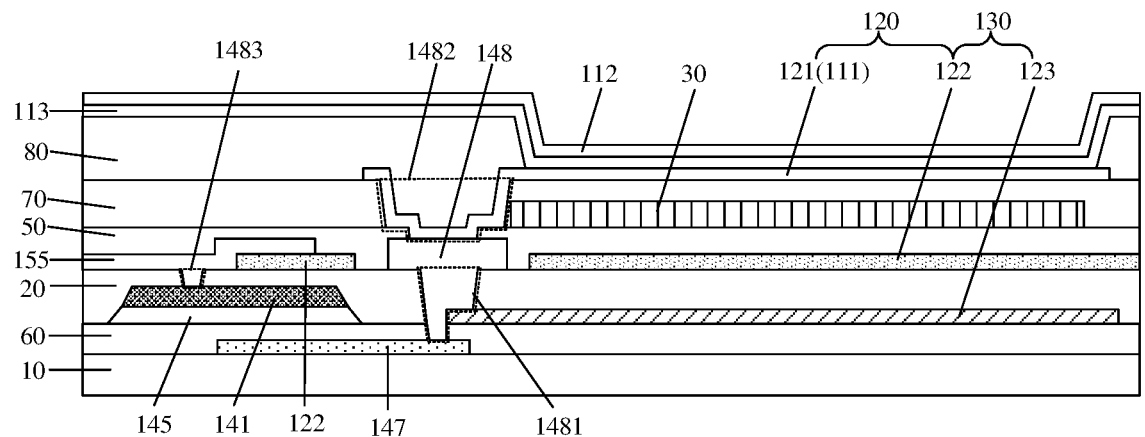
FIG. 11 is a schematic cross-sectional view of the sub-pixel S shown in FIG. 10 taken along the line FF'.

As shown in FIG. 11, the metal pattern 147, the first storage electrode 121, and the third storage electrode 123 are electrically connected through the second connection electrode 148, and the second connection electrode 148 is disposed in a same layer and made of a same material as the first source 143.

As shown in FIG. 11, in a case where the display substrate 1 includes the metal pattern 147, the display substrate 1 further includes a buffer layer 60 located on a side of the metal pattern 147 away from the base 10 and covering the metal pattern 147. In this case, the second connection electrode 148 is in contact with the metal pattern 147 through a via hole 1481 penetrating the interlayer insulating layer 20 and the buffer layer 60, and is in contact with the third storage electrode 123 through the via hole 1481. The first storage electrode 121 is in contact with the second connection electrode 148 through a via hole 1482 penetrating the planarization layer 70 and the passivation layer 50. As a result, electrical connections between the metal pattern 147 and the first storage electrode 121 and between the metal pattern 147 and the third storage electrode 123 may be achieved.

The metal pattern 147 may prevent external light from being incident on the first semiconductor active pattern 142, thereby preventing the external light from adversely affecting performance of the first transistor T1. Moreover, in a case where the metal pattern 147 is disposed in the display substrate 1, the metal pattern 147 is electrically connected to the third storage electrode 123 and the first storage electrode 121, so that a parasitic capacitance may be avoided at the position of the metal pattern 147 during use of the display substrate 1.

Optionally, as shown in FIGS. 1 and 9, the power line 18, the sensing signal line 40, and the data line 17 are arranged in parallel and in the same layer, which is beneficial to simplify a wiring design of signal lines in the display substrate 1.

In some embodiments, as shown in FIG. 9, in each row of sub-pixels, every two adjacent sub-pixels S are as a group, and two data lines 17 are disposed between the two sub-pixels S in each group. A position at a side of each group of sub-pixels S is provided with one power line 18, and a position at an opposite side of each group of sub-pixels S is provided with one sensing signal line 40, and the power lines 18 and the sensing signal lines 40 are arranged alternately.

For each row of sub-pixels, pixel driving circuits in two sub-pixels S located at a side of the power line 18 and proximate to the power line 18 and pixel driving circuits in two sub-pixels S located at the other side of the power line 18 and proximate to the power line 18 are all electrically connected to the power line 18.

For each row of sub-pixels, pixel driving circuits in two sub-pixels S located at a side of the sensing signal line 40 and proximate to the sensing signal line 40 and pixel driving circuits in two sub-pixels S located at the other side of the sensing signal line 40 and proximate to the sensing signal line 40 are all electrically connected to the sensing signal line 40.

Based on this, total numbers of the power lines 18 and the sensing signal lines 40 may be reduced, thereby simplifying the manufacturing process of the display substrate 1.

Figure 13:
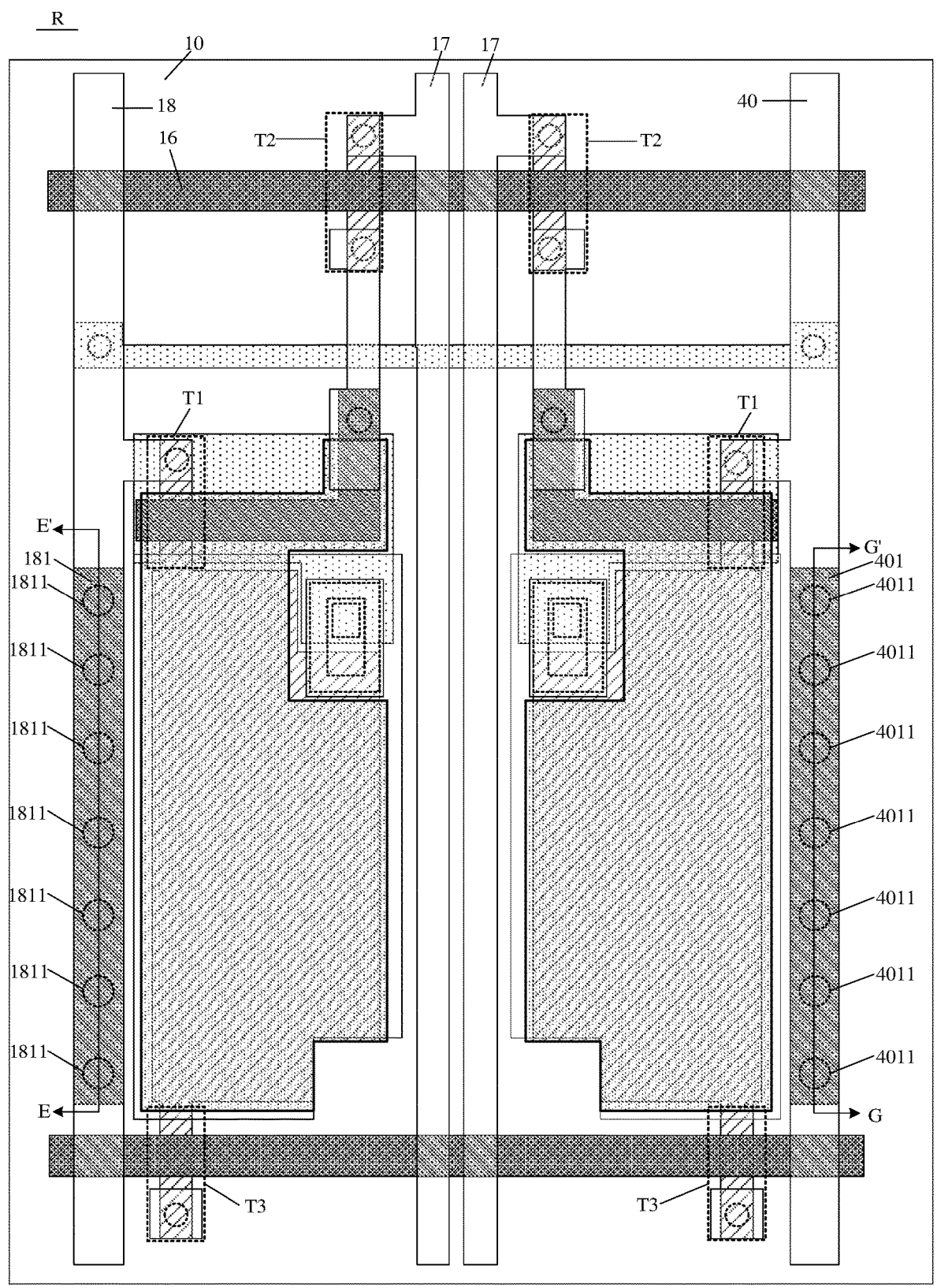
FIG. 13 is a schematic diagram showing a structure of the display substrate shown in FIG. 9 in an R region.

Optionally, as shown in FIGS. 9, 13, and 14, the display substrate 1 further includes a first auxiliary electrode 181 disposed corresponding to any power line 18. An orthogonal projection of the first auxiliary electrode 181 on the base 10 is located within an orthogonal projection of the power line 18 on the base 10 in the thickness direction of the base 10. The first auxiliary electrode 181 is electrically connected to the power line 18 through a plurality of first via holes 1811. That is, the first auxiliary electrode 181 and the power line 18 are in parallel. In this way, it is beneficial to reduce an equivalent resistance of the power line 18, thereby reducing a loss of signals transmitted by the power line 18.

In addition, as shown in FIGS. 9, 13, and 15, the display substrate 1 further includes a second auxiliary electrode 401 disposed corresponding to any sensing signal line 40. An orthogonal projection of the second auxiliary electrode 401 on the base 10 is located within an orthogonal projection of the sensing signal line 40 on the base 10 in the thickness direction of the base 10. The second auxiliary electrode 401 is electrically connected to the sensing signal line 40 through a plurality of second via holes 4011. That is, the second auxiliary electrode 401 and the sensing signal line 40 are in parallel. In this way, it is beneficial to reduce an equivalent resistance of the sensing signal line 40, thereby reducing a loss of signals transmitted by the sensing signal line 40.

In some examples, the first auxiliary electrode 181, the second auxiliary electrode 401, and the first gate 141 are disposed in the same layer and made of the same material. Based on this, the first auxiliary electrode 181 and the second auxiliary electrode 401 may be formed while the first gate 141 is formed, thereby simplifying the manufacturing process of the display substrate 1.

In some embodiments, the display substrate 1 further includes a filter unit disposed in each sub-pixel S, so as to achieve color display of the display substrate 1 using the filter unit. Based on this, optionally, as shown in FIGS. 7 and 11, the display substrate 1 further includes: filter units 30 disposed between the first storage electrode 121 and the second storage electrode 122 in each sub-pixel S, and a planarization layer 70 disposed on a side of the filter units 30 proximate to the first storage electrode 121.

Herein, optionally, the filter unit 30 is a color filter film.

Based on this, optionally, in the display substrate 1 adopting an RGB color mode for display, a filter unit 30 located in a red sub-pixel is a red filter unit, a filter unit 30 located in a green sub-pixel is a green filter unit, and a filter unit 30 located in a blue sub-pixel is a blue filter unit. Moreover, in this case, the light-emitting layer 113 in the light-emitting device 110 emits white light, and the light-emitting layers 113 in all sub-pixels may be connected as a whole layer to be laid.

Optionally, the first transistor T1, the second transistor T2, and the third transistor T3 are all top-gate thin film transistors.

Some embodiments of the present disclosure provide a method for manufacturing the display substrate 1. As shown in FIG. 16, the method for manufacturing the display substrate 1 includes steps 10 and 20 (S10 and S20).

In S10, as shown in FIGS. 1 and 2, the pixel driving circuit located in each sub-pixel S is formed in the display area AA on the base 10.

The pixel driving circuit includes the first storage capacitor 120 and the second storage capacitor 130 connected in parallel. The first storage capacitor 120 includes the first storage electrode 121 and the second storage electrode 122 that are disposed oppositely. The second storage capacitor 130 includes the second storage electrode 122 and the third storage electrode 123 disposed opposite to the second storage electrode 122. The second storage electrode 122 is located between the first storage electrode 121 and the third storage electrode 123 in the thickness direction of the base 10. The first storage electrode 121 is electrically connected to the third storage electrode 123, and the first storage electrode 121 is located at a side of the second storage electrode 122 away from the base 10.

The first electrode 121, the second storage electrode 122, and the third storage electrode 123 are all transparent electrodes.

In S20, the bottom-emission light-emitting device in each sub-pixel S on the base 10 is formed on a side of the pixel driving circuit away from the base 10.

As shown in FIGS. 3a and 3b, the light-emitting device 110 includes a first electrode 111. As shown in FIG. 7, the first electrode 111 is connected to the pixel driving circuit. In addition, the first storage electrode 121 serves as the first electrode 111.

Beneficial effects that can be achieved by the method for manufacturing the display substrate 1 provided by the embodiments of the present disclosure are the same as beneficial effects that can be achieved by the display substrate 1 provided by the embodiments described above, and will not be repeated herein again.

Optionally, as shown in FIGS. 1, 2, and 5, the pixel driving circuit further includes the first transistor T1, and the first transistor T1 includes the first gate 141, the first semiconductor active pattern 142, and the first source 143. The first transistor T1 is a driving transistor. The first semiconductor active pattern 142 includes the first channel portion 1421, the first source portion 1422, and the first drain portion 1423, and the electrical conductivities of the first source portion 1422 and the first drain portion 1423 are greater than the electrical conductivity of the first channel portion 1421. The first source 143 is in contact with the first source portion 1422.

Forming the pixel driving circuit in S10 further includes: simultaneously forming the third storage electrode 123 in a process of forming the first semiconductor active pattern 142, so that the third storage electrode 123 is connected to the first drain portion 1423, and the third storage electrode 123 and the first drain portion 1423 are of an integral structure.

Herein, the third storage electrode 123 is a semiconductor pattern that has undergone a conducting processing. Since the third storage electrode 123 is electrically connected to the first storage electrode 121, and the first storage electrode 121 may serve as the first electrode 111 of the light-emitting device 110, there is no need to form a separate first drain in the first transistor T1 to be electrically connected to the first electrode 111.

During the manufacturing, a semiconductor pattern located at positions of the first transistor T1 and the third storage electrode 123 is formed first, and then other regions of the semiconductor pattern except a position of the first channel portion 1421 of the first transistor T1 are conducted. For example, the conducting process may be performed by adopting a manner of ion implantation, and ions may be boron ions or phosphorus ions.

Optionally, as shown in FIGS. 1, 2, and 6, the display substrate 1 further includes the gate line 16 and the data line 17 that are electrically connected to the pixel driving circuit. The pixel driving circuit further includes the second transistor T2, and the second transistor T2 includes the second gate 151, the second semiconductor active pattern 152, the second source 153, and the second drain 154. The second semiconductor active pattern 152 includes the second channel portion 1521, the second source portion 1522, and the second drain portion 1523, and the electrical conductivities of the second source portion 1522 and the second drain portion 1523 are greater than the electrical conductivity of the second channel portion 1521. The second source 153 is in contact with the second source portion 1522, and the second drain 154 is in contact with the second drain portion 1523.

Each sub-pixel S corresponds to a gate line 16, and a portion of the gate line 16 may serve as the second gate 151. In this way, the method for manufacturing the display substrate 1 further includes: simultaneously forming the gate line 16 and the first gate 141 in a process of performing S10. As a result, the manufacturing process of the display substrate 1 may be simplified.

As shown in FIGS. 1, 2 and 7, the display substrate 1 further includes the first connection electrode 155 disposed in each sub-pixel S. The second source 153 is electrically connected to the data line 17, and the second drain 154 is electrically connected to the first connection electrode 155, and the second drain 154 and the first connection electrode 155 are of an integral structure. The first connection electrode 155 is further electrically connected to both the first gate 141 and the second storage electrode 122. That is, electrical connections among the first transistor T1, the second transistor T2, the first storage capacitor 120, and the second storage capacitor 130 may be achieved through the first connection electrode 155.

The method for manufacturing the display substrate 1 further includes: simultaneously forming the second semiconductor active pattern 152 in a process of forming the first semiconductor active pattern 142, and simultaneously forming the first connection electrode 155, the second source 153, the second drain 154 and the data line 17 in a process of forming the first source 143. As a result, the manufacturing process of the display substrate 1 may be simplified.

Further, optionally, as shown in FIGS. 1, 2, and 8, the display substrate 1 further includes the power lines 18 and the sensing signal lines 40. The first source 143 is electrically connected to the power line 18. The pixel driving circuit further includes the third transistor T3, and the third transistor T3 includes the third gate 191, the third semiconductor active pattern 192, and the third drain 193. The third semiconductor active pattern 192 includes the third channel portion 1921, the third source portion 1922, and the third drain portion 1923, and the electrical conductivities of the third source portion 1922 and the third drain portion 1923 are greater than the electrical conductivity of the third channel portion 1921. The third source portion 1922 is connected to the third storage electrode 123, and the third source portion 1922 and the third storage electrode 123 are of an integral structure. The third drain 193 is in contact with the third drain portion 1923, and the third drain 193 is electrically connected to the sensing signal line 40.

The first transistor T1 and the third transistor T3 are located at both sides of the first storage capacitor 120. For the third gates 191 of the third transistors T3 in any row of sub-pixels S, portions of the gate line 16 connected to second transistors in an adjacent row of sub-pixels S closest to the third transistors T3 in the row of sub-pixels serve as the third gates 191 of the third transistors T3.

The method for manufacturing the display substrate 1 further includes: simultaneously forming the third semiconductor active pattern 192 and the second semiconductor active pattern 152, and simultaneously forming the third drain 193, the power lines 18, the sensing signal lines 40 in a process of forming the data lines 17. As a result, the manufacturing process of the display substrate 1 may be simplified.

Optionally, as shown in FIGS. 9 to 12, in a case where the display substrate 1 further includes the metal pattern 147, the method for manufacturing the display substrate 1 further includes:

before forming the pixel driving circuit, that is, before S10 is performed, forming the metal pattern 147 on the base 10, so that after the pixel driving circuit is formed, an orthogonal projection of the first semiconductor active pattern 142 on the base 10 is within an orthogonal projection of the metal pattern 147 on the base 10 in the thickness direction of the base.

A structure and a function of the metal pattern 147 are as described in some embodiments above, and will not be repeated herein.

Optionally, referring to FIGS. 7 and 11, in a case where the display substrate 1 further includes the second connection electrode 148, the method for manufacturing the display substrate 1 further includes: simultaneously forming the second connection electrode 148 in the process of forming the first source 143, so that the second connection electrode 148 is electrically connected to the metal pattern 147, the first storage electrode 121, and the third storage electrode 123.

As shown in FIG. 11, in a case where the display substrate 1 includes the metal pattern 147, the display substrate 1 further includes the buffer layer 60 located on the side of the metal pattern 147 away from the base 10 and covering the metal pattern 147. In this case, the second connection electrode 148 is in direct contact with the metal pattern 147 through the via hole 1481 penetrating the interlayer insulating layer 20 and the buffer layer 60, and is in contact with the third storage electrode 123 through the via hole 1481. The first storage electrode 121 is in direct contact with the second connection electrode 148 through the via hole 1482 penetrating the planarization layer 70 and the passivation layer 50, thereby achieving electrical connections between the metal pattern 147 and the first storage electrode 121, and between the metal pattern 147 and the third storage electrode 123.

In a case where the display substrate 1 includes the first connection electrode 155 and the second connection electrode 148, in order to achieve the electrical connections between the first connection electrode 155 and the first gate 141, and between the first connection electrode 155 and the second storage electrode 122, and the electrical connections between the second connection electrode 148 and the metal pattern 147, between the second connection electrode 148 and the first storage electrode 121, and between the second connection electrode 148 and the third storage electrode 123, the method of manufacturing the first connection electrode 155 and the second connection electrode 148 is as follows.

Figure 17:
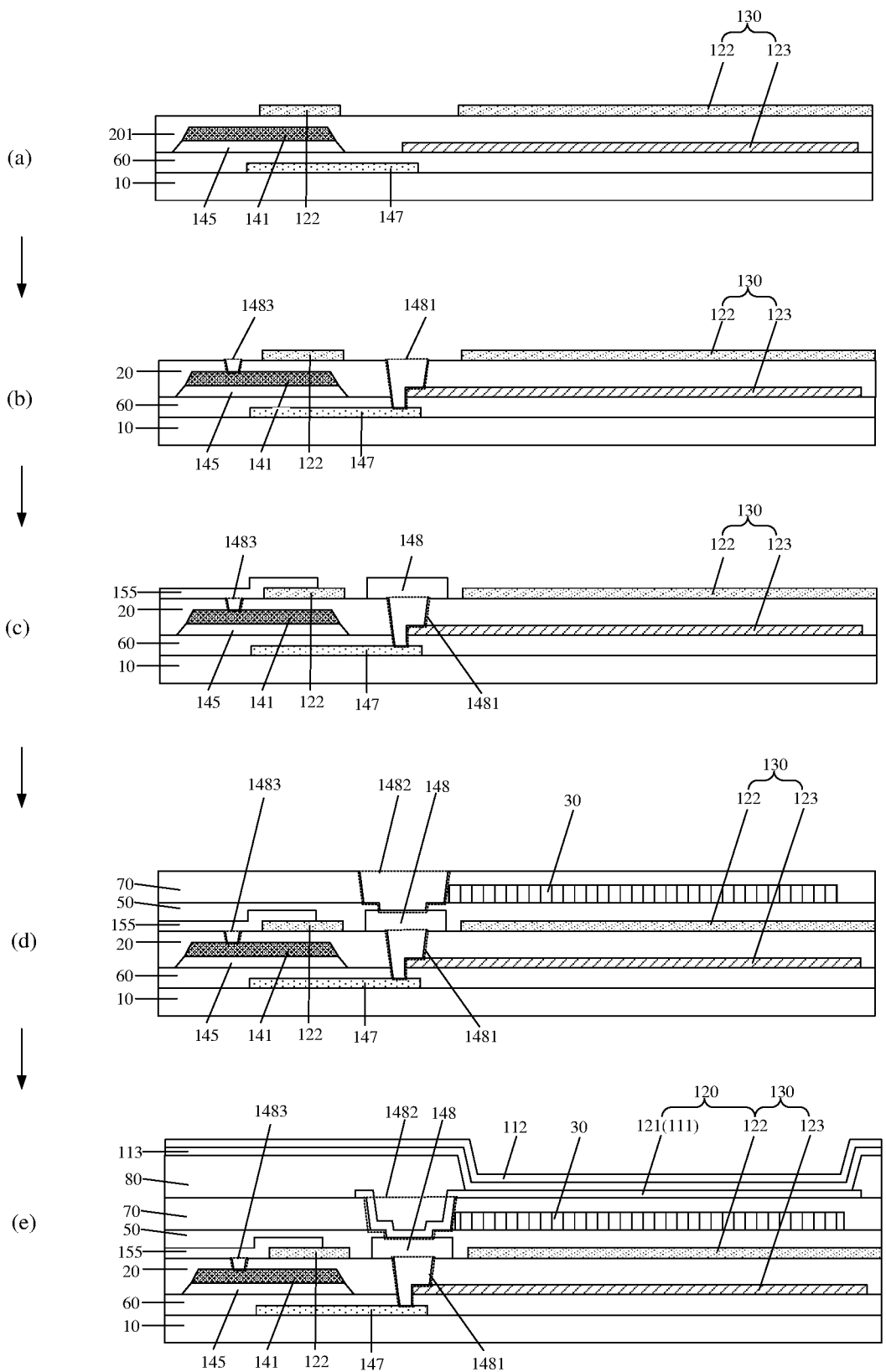
FIG. 17 is a schematic diagram showing manufacturing processes of a display substrate, in accordance with some embodiments of the present disclosure.

As shown in (a) in FIG. 17, an interlayer insulating film 201 is formed on the base 10 on which the metal pattern 147, the buffer layer 60, the first semiconductor active pattern 142, the third storage electrode 123, and the first gate 141 are formed, and then the second storage electrode 122 is formed.

Then, as shown in (b) in FIG. 17, a patterning process is performed on the interlayer insulating film 201 to form the via hole 1483 penetrating the interlayer insulating film 201, so that a portion of the first gate 141 is exposed by the via hole 1483; and the via hole 1481 penetrating the interlayer insulating film 201 and the buffer layer 60 is formed simultaneously, so that portions of the metal pattern 147 and the third storage electrode 123 are exposed by the via hole 1481. After the via holes are formed in the interlayer insulating film through the patterning process, the interlayer insulating film becomes the interlayer insulating layer 20.

Then, as shown in (c) in FIG. 17, the first connection electrode 155 and the second connection electrode 148 are simultaneously formed. The first connection electrode 155 is lapped on the second storage electrode 122, and is in direct contact with the second storage electrode 122, and the first connection electrode 155 is electrically connected to the first gate 141 through the via hole 1483 penetrating the interlayer insulating layer 20. In addition, the second connection electrode 148 is electrically connected to the metal pattern 147 and the third storage electrode 123 through the via hole 1481 penetrating the interlayer insulating layer 20 and the buffer layer 60.

It will be understood that, in the process of forming the first connection electrode 155 and the second connection electrode 148, the second source 153, the second drain 154, the data lines 17, and the first source 143 may also be formed simultaneously.

Further, as shown in (d) in FIG. 17, the passivation layer 50, the filter unit 30 located in the sub-pixel, and the planarization layer 70 are sequentially formed. The passivation layer 50 and the planarization layer 70 have the via hole 1482 penetrating the passivation layer 50 and the planarization layer 70. A portion of the second connection electrode 148 is exposed by the via hole 1482.

Thereafter, as shown in (e) in FIG. 17, the first storage electrode 121 (or the first electrode 111) is formed, so that the first storage electrode 121 is electrically connected to the second connection electrode 148 through the via hole 1482 penetrating the passivation layer 50 and the planarization layer 70. Then, the pixel defining layer 80, the light-emitting layer 113, and the second electrode 112 are sequentially formed.

The metal pattern 147 may prevent external light from being incident on the first semiconductor active pattern 142 and affecting performance of the first transistor T1. Moreover, in a case where the metal pattern 147 is disposed in the display substrate 1, the metal pattern 147 is electrically connected to the first storage electrode 121 and the third storage electrode 123, so that a parasitic capacitance may be avoided at the position of the metal pattern 147 during use of the display substrate 1.

Figure 18:
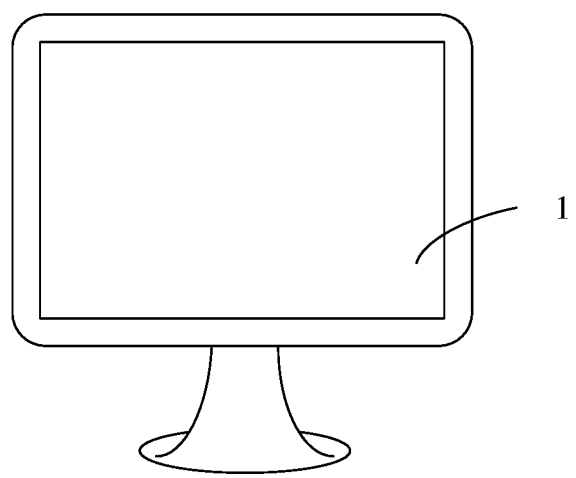
FIG. 18 is a schematic diagram showing a structure of a display apparatus, in accordance with some embodiments of the present disclosure.

The embodiments of the present disclosure provide a display apparatus. As shown in FIG. 18, the display apparatus 1000 includes the display substrate 1 in some embodiments described above. Beneficial effects that can be achieved by the display apparatus 1000 provided by the embodiments of the present disclosure are the same as the beneficial effects that can be achieved by the display substrate 1 provided by the above embodiments, and will not be repeated herein again.

In some embodiments, the display apparatus 1000 is a product or component with a display function such as an OLED display substrate, an OLED display, an OLED television, a mobile phone, a tablet computer, a notebook computer, an electronic paper, a digital photo frame, or a navigator.

In the description of the above embodiments, specific features, structures, materials or characteristics may be combined in any suitable manner in any one or more embodiments or examples.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area provided with a plurality of sub-pixels, the display substrate comprising:
a base;
power lines; and
a pixel driving circuit and a bottom-emission light-emitting device that are disposed on the base and located in each sub-pixel in the display area; the light-emitting device including a first electrode electrically connected to the pixel driving circuit; and the pixel driving circuit including a first storage capacitor and a second storage capacitor connected in parallel; wherein
the first storage capacitor includes a first storage electrode and a second storage electrode that are disposed oppositely; and the first electrode serves as the first storage electrode;
the second storage capacitor includes the second storage electrode and a third storage electrode disposed opposite to the second storage electrode;
the second storage electrode is located between the first storage electrode and the third storage electrode in a thickness direction of the base; and the first storage electrode is electrically connected to the third storage electrode;
the first electrode, the second storage electrode, and the third storage electrode are all transparent electrodes;
wherein the pixel driving circuit further includes a first transistor; the first transistor includes a first gate, a first semiconductor active pattern, and a first source, and the first transistor is a driving transistor;

the first semiconductor active pattern includes a first channel portion, a first source portion, and a first drain portion, and electrical conductivities of the first source portion and the first drain portion are greater than an electrical conductivity of the first channel portion; the first source is in contact with the first source portion, and electrically connected to a power line; and the third storage electrode is a semiconductor pattern that has undergone a conducting processing, the third storage electrode and the first drain portion are connected to each other, and are of an integral structure.

2. The display substrate according to claim 1, further comprising:

a gate line and a data line that are electrically connected to the pixel driving circuit; and a first connection electrode disposed in the sub-pixel; wherein the pixel driving circuit further includes a second transistor, the second transistor includes a second gate, a second semiconductor active pattern, a second source and a second drain;

a portion of the gate line serves as the second gate;

the second source is electrically connected to the data line;

the second drain and the first connection electrode are of an integral structure; and the first connection electrode is electrically connected to the first gate and the second storage electrode.

3. The display substrate according to claim 2, wherein the first connection electrode is in direct contact with the second storage electrode, and the first connection electrode is electrically connected to the first gate through a via hole.

4. The display substrate according to claim 2, further comprising: sensing signal lines, the pixel driving circuit being electrically connected to a sensing signal line; wherein the pixel driving circuit further includes a third transistor, and in an extension direction of the sensing signal line the first transistor and the third transistor are located at both sides of the first storage capacitor; and the third transistor includes a third gate, a third semiconductor active pattern, and a third drain; the third semiconductor active pattern includes a third channel portion, a third source portion, and a third drain portion, and electrical conductivities of the third source portion and the third drain portion are greater than an electrical conductivity of the third channel portion; the third source portion and the third storage electrode are connected to each other, and are of an integral structure; and the third drain is in contact with the third drain portion, and is electrically connected to the sensing signal line.

5. The display substrate according to claim 4, wherein forth id gates of third transistors located in any row of sub-pixels, portions of the gate line connected to second transistors in an adjacent row of sub-pixels closest to the third transistors in the row of sub-pixels serve as the third gates of the third transistors.

6. The display substrate according to claim 4, wherein the power line, the sensing signal line, and the data line are arranged in parallel and in a same layer;

in each row of sub-pixels, every two adjacent sub-pixels are as a group, and two data lines are disposed between the two sub-pixels in each group; a position at a side of each group of sub-pixels is provided with one power line, a position at an opposite side of the group of sub-pixels is provided with one sensing signal line, and the power lines and the sensing signal lines are arranged alternately;

for each row of sub-pixels, pixel driving circuits in two sub-pixels located at a side of the power line and proximate to the power line and pixel driving circuits in two sub-pixels located at another side of the power line and proximate to the power line are all electrically connected to the power line; and for each row of sub-pixels, pixel driving circuits in two sub-pixels located at a side of the sensing signal line and proximate to the sensing signal line and pixel driving circuits in two sub-pixels located at another side of the sensing signal line and proximate to the sensing signal line are all electrically connected to the sensing signal line.

7. The display substrate according to claim 6, further comprising: a first auxiliary electrode disposed corresponding to any power line, and a second auxiliary electrode disposed corresponding to any sensing signal line; wherein an orthogonal projection of the first auxiliary electrode on the base is located within an orthogonal projection of the power line on the base in the thickness direction of the base; and the first auxiliary electrode is electrically connected to the power line through a plurality of first via holes;

an orthogonal projection of the second auxiliary electrode on the base is located within an orthogonal projection of the sensing signal line on the base in the thickness direction of the base; and the second auxiliary electrode is electrically connected to the sensing signal line through a plurality of second via holes; and the first auxiliary electrode, the second auxiliary electrode, and the first gate are arranged in a same layer and made of a same material.

8. The display substrate according to claim 1, further comprising:

filter units disposed between the first storage electrode and the second storage electrode in the sub-pixel; and a planarization layer disposed on a side of the filter units proximate to the first storage electrode.

9. The display substrate according to claim 1, wherein the first transistor is a top-gate thin film transistor;

the display substrate further comprises a metal pattern disposed at a side of the first semiconductor active pattern proximate to the base; and an orthogonal projection of the first semiconductor active pattern on the base is located within an orthogonal projection of the metal pattern on the base in the thickness direction of the base; and the display substrate further comprises a second connection electrode disposed in the sub-pixel; and the metal pattern, the first storage electrode, and the third storage electrode are electrically connected through the second connection electrode, and the second connection electrode and the first source are arranged in a same layer and made of a same material.

10. A method for manufacturing a display substrate, comprising:

forming a pixel driving circuit located in each sub-pixel in a display area on a base; the pixel driving circuit including a first storage capacitor and a second storage capacitor connected in parallel; the first storage capacitor including a first storage electrode and a second storage electrode that are disposed oppositely, and the second storage capacitor including the second storage electrode and a third storage electrode disposed opposite to the second storage electrode; wherein the second storage electrode is located between the first storage electrode and the third storage electrode in a thickness direction of the base; the first storage electrode is electrically connected to the third storage electrode, and is located at a side of the second storage electrode away from the base; and the first storage electrode, the second storage electrode, and the third storage electrode are all transparent electrodes; and forming a bottom-emission light-emitting device in the sub-pixel on the base, the bottom-emission light-emitting device being located on a side of the pixel driving circuit away from the base; and the light-emitting device including a first electrode electrically connected to the pixel driving circuit, and the first storage electrode serving as the first electrode;

wherein the pixel driving circuit further includes a first transistor, and the first transistor is a driving transistor; the first transistor includes a first gate, a first semiconductor active pattern, and a first source; the first semiconductor active pattern includes a first channel portion, a first source portion and a first drain portion, and electrical conductivities of the first source portion and the first drain portion are greater than an electrical conductivity of the first channel portion; and the first source is in contact with the first source portion; and forming the pixel driving circuit further includes:

simultaneously forming the third storage electrode in a process of forming the first semiconductor active pattern, so that the third storage electrode and the first drain portion are connected to each other, and are of an integral structure.

11. The method according to claim 10, wherein the display substrate further includes: a gate line and a data line that are electrically connected to the pixel driving circuit, and a first connection electrode disposed in the sub-pixel;

the pixel driving circuit further includes a second transistor, and the second transistor includes a second gate, a second semiconductor active pattern, a second source and a second drain; the second semiconductor active pattern includes a second channel portion, a second source portion and a second drain portion, and electrical conductivities of the second source portion and the second drain portion are greater than an electrical conductivity of the second channel portion; and the second source is in contact with the second source portion, and the second drain is in contact with the second drain portion;

forming the pixel driving circuit further includes: simultaneously forming the second semiconductor active pattern in a process of forming the first semiconductor active pattern;

a portion of the gate line serves as the second gate; and the method further comprises: simultaneously forming the gate line in a process of forming the first gate; and the second source is electrically connected to the data line; the second drain and the first connection electrode are electrically connected to each other, and are of an integral structure; the first connection electrode is further electrically connected to the first gate and the second storage electrode; and the method for manufacturing the display substrate further comprises: simultaneously forming the first connection electrode, the second source, the second drain, and the data line in a process of forming the first source.

12. The method according to claim 11, wherein the display substrate further includes a power line and a sensing signal line that are electrically connected to the pixel driving circuit; the first source is electrically connected to the power line; the pixel driving circuit further includes a third transistor, and the third transistor includes a third gate, a third semiconductor active pattern, and a third drain; the third semiconductor active pattern includes a third channel portion, a third source portion and a third drain portion, and electrical conductivities of the third source portion and the third drain portion are greater than an electrical conductivity of the third channel portion; the third source portion and the third storage electrode are connected to each other, and are of an integral structure; and the third drain is in contact with the third drain portion, and is electrically connected to the sensing signal line;

the first transistor and the third transistor are located at both sides of the first storage capacitor in an extension direction of the sensing signal line; and for third gates of third transistors located in any row of sub-pixels, portions of the gate line connected to second transistors in an adjacent row of sub-pixels closest to the third transistors in the row of sub-pixels serve as the third gates of the third transistors; and forming the pixel driving circuit further includes: simultaneously forming the third semiconductor active pattern in a process of forming the second semiconductor active pattern;

the method further comprises:

simultaneously forming the third drain, the power line, and the sensing signal line in a process of forming the data line.

13. The method according to claim 11, further comprising:

forming a metal pattern on the base before forming the pixel driving circuit, so that after the pixel driving circuit is formed, an orthogonal projection of the first semiconductor active pattern on the base is within an orthogonal projection of the metal pattern on the base in the thickness direction of the base.

14. The method according to claim 13, wherein the display substrate further includes a second connection electrode disposed in the sub-pixel; and the method further comprises: simultaneously forming the second connection electrode in a process of forming the first source, so that the second connection electrode is electrically connected to the metal pattern, the first storage electrode, and the third storage electrode.

15. The display substrate according to claim 8, wherein the plurality of sub-pixels includes red sub-pixels, green sub-pixels and blue sub-pixels, a filter unit located in a red sub-pixel is a red filter unit, a filter unit located in a green sub-pixel is a green filter unit, and a filter unit located in a blue sub-pixel is a blue filter unit;

the light-emitting device includes a light-emitting layer configured to emit white light, and light-emitting layers in all sub-pixels are connected as a whole layer.

16. The display substrate according to claim 9, further comprising a buffer layer disposed on a side of the metal pattern away from the base and covering the metal pattern, and an interlayer insulating layer disposed on a side of the first gate away from the base; wherein the second connection electrode is in contact with the metal pattern and the third storage electrode through a via hole penetrating the interlayer insulating layer and the buffer layer.

* * * * *

UNITED STATES PATENT AND TRADEMARK OFFICE
CERTIFICATE OF CORRECTION

PATENT NO. : 11,882,729 B2
APPLICATION NO. : 17/433435
DATED : January 23, 2024
INVENTOR(S) : Can Yuan, Yongqian Li and Zhidong Yuan It is certified that error appears in the above-identified patent and that said Letters Patent is hereby corrected as shown below:

In the Claims

In Column 21, Line 55, please change "forth id" to --for third--

Signed and Sealed this
Ninth Day of April, 2024

Katherine Kelly Vidal
*Director of the United States Patent and Trademark Office*